United States Patent [19]
Hampden-Smith et al.

[11] Patent Number: 5,656,329
[45] Date of Patent: Aug. 12, 1997

[54] CHEMICAL VAPOR DEPOSITION OF METAL OXIDE FILMS THROUGH ESTER ELIMINATION REACTIONS

[75] Inventors: Mark Hampden-Smith; Toivo Kodas, both of Albuquerque, N. Mex.

[73] Assignee: Texas Instruments Incorporated, Dallas, Tex.

[21] Appl. No.: 403,148

[22] Filed: Mar. 13, 1995

[51] Int. Cl.$^6$ .................................................. C23C 16/40
[52] U.S. Cl. ................... 427/226; 427/255.2; 427/255.3
[58] Field of Search ........................ 427/126.3, 226, 427/255.2, 255.3

[56] References Cited

U.S. PATENT DOCUMENTS

| | | | |
|---|---|---|---|
| 5,217,754 | 6/1993 | Santiago-Aviles et al. | 427/226 |
| 5,225,561 | 7/1993 | Kirlin et al. | 546/256 |
| 5,266,355 | 11/1993 | Wernberg et al. | 427/248 |
| 5,277,789 | 1/1994 | Kounaves et al. | 205/238 |
| 5,278,138 | 1/1994 | Ott et al. | 505/1 |
| 5,280,012 | 1/1994 | Kirlin et al. | 505/1 |
| 5,308,601 | 5/1994 | Hampden-Smith et al. | 423/593 |
| 5,343,353 | 8/1994 | Miki et al. | 361/322 |
| 5,391,393 | 2/1995 | Maniar | 427/100 |
| 5,453,908 | 9/1995 | Tsu et al. | 361/321.5 |
| 5,514,822 | 5/1996 | Scott et al. | 556/28 |

OTHER PUBLICATIONS

Kim et al., "Preparation of BaTiO3 Thin Films by Metalorganic Chemical Vapor Deposition Using Ultrasonic Spraying" Japn. J. App. Phys. vol. 33 (Jul. 1994) pp. 5125–5128.
Kirk–Othmer Encyclopedia of Chemical Technology, Third Edition, vol. 10, John Wiley & Sons, New York, pp. 1–29 (month unknown). 1980.
Ullmann's Encyclopedia of Industrial Chemistry, Fifth Edition, vol. A10, Weinheim, Germany, pp. 309–329 (month unavailable). 1987.

"The Synthesis and Characterization of Pb($O_2$ $CCH_3$)$_2$(18–Crown–6) * 3$H_2$ O, a Monomeric Lead (II)Carboxylate Compound", Yeung–Gyo Shin, et al., Micro Engineered Ceramics, U of New Mexico, 1453–1457, Mar. 4, 1993.

"Preparation of Ferroelectric $BaTiO_3$ Thin Films by Metal Organic Chemical Vapour Deposition" C. H. Lee et al., Department of Inorganic Materials Engineering, Seoul National University, Korea, 219–224, 1990 (month unknown).

(List continued on next page.)

*Primary Examiner*—Shrive Beck
*Assistant Examiner*—Timothy Meeks
*Attorney, Agent, or Firm*—James E. Harris; Richard A. Stoltz; Richard L. Donaldson

[57] ABSTRACT

A method of depositing a thin film of a metal oxide by chemical vapor deposition is disclosed. This method is applicable to, e.g., forming thin films of perovskite-phase titanates, zirconates, and/or niobates of divalent metals such as Ba, Sr, and/or Ca. In one example, a first precursor comprises a divalent metal coordinated to carboxylate and polyether ligands, and a second precursor comprises a tetravalent metal coordinated to one or more alkoxide ligands. These precursors are delivered in a mixed stable vapor phase 12 to a preferably heated substrate 14, where a surface-mediated reaction between the two precursors releases a volatile ester and deposits an intermediate compound film 18 comprising the divalent metal, the tetravalent metal and oxygen on the substrate. The substrate may be subsequently annealed to drive off unreacted ligands and/or fully crystallize the intermediate compound film into a perovskite-phase film 20. The present invention may be used to deposit carbonate-free films at temperatures generally less than 500° C., and may also be used to control stoichiometry and homgeneity of the resulting film.

25 Claims, 1 Drawing Sheet

OTHER PUBLICATIONS

"Chemical Aspects of Solution Routes to Perovskite–Phase Mixed–Metal Oxides from Metal–Organic Precursors", Clive D. Chandler, et al., American Chemical Society, Chemical Reviews, vol. 93, No. 3, 1205–1241, Feb. 1993.

"Combustion Chemical Vapor Deposition: A Novel Thin–Film Deposition Technique", A. T. Hunt, et al., American Institute of Physics, Appl. Phys. Lett. 63(2), Jul. 12,'93, 266–268.

"Aerosol–Assisted Chemical Vapor Deposition of Copper: A Liquid Delivery Approach to Metal Thin Films", Christophe Roger, et al., American Institute of Physics, Appl. Phys. Lett. 65(8), Aug. 22, 1994, 1021–1023.

CHEMICAL VAPOR DEPOSITION OF METAL OXIDE FILMS THROUGH ESTER ELIMINATION REACTIONS

FIELD OF THE INVENTION

This invention relates to chemical vapor deposition (CVD) of metal oxide films, and more particularly to CVD of perovskite-phase mixed-metal oxides using organometallic precursors and/or metalorganic precursors.

BACKGROUND OF THE INVENTION

Thin film deposition encompasses a group of techniques for forming a thin layer (i.e. less than 5 μm in thickness) of a solid material on the surface of a workpiece. It is generally desirable that such a film be homogeneous, uniform in thickness, and extremely pure. In the semiconductor industry, for example, the fabrication of microelectronic circuits on a substrate of single-crystal silicon typically requires that several thin films of both insulating and conducting materials be formed and patterned sequentially on the substrate surface. Common thin film deposition techniques include physical vapor deposition such as sputtering, drying a film from a liquid coating deposited by a spin-on technique, and chemical vapor deposition.

Chemical vapor deposition in general involves delivery of one or more constituents or precursors in a vapor phase which, upon contacting a (usually heated) substrate, decompose to produce a film in a surface-catalyzed reaction. Various CVD techniques are commonly used for deposition of epitaxial silicon, polysilicon, silicon dioxide, and silicon nitride. More recently, CVD of tungsten and titanium nitride has been developed. However, CVD of most metal oxides, and particularly of compound metal oxides, has been far less successful, partially because of the unsuitability of available precursors. Known metal precursors often have: low volatility which severely limits achievable deposition rate; limited stability and therefore decompose or react before reaching the substrate; or have ligands (molecules, ions, or atoms attached to a central atom) which fail to completely dissociate from the metal upon reaching the substrate, leaving impurities such as carbon or fluorine in the deposited film.

One promising class of precursors for use with barium, strontium, and calcium, is suggested in U.S. Pat. 5,280,012, issued to Kirlin et al. on Jan. 18, 1994. These metalorganic precursors are of a formula $MA_2X$, where M is barium, strontium, or calcium, A is a monodentate or multidentate (multidentate infers a capability to donate two or more pairs of electrons in a complexation reaction) organic ligand coordinated to M which allows complexing of $MA_2$ with a ligand X to form a stable subcomplex, and X is a monodentate or multidentate organic ligand coordinated to M and containing only atoms selected from the group consisting of C, N, H, S, O, and F.

Unfortunately, additional difficulties arise when thin films of, e.g., compound metal oxides are desired, even if stable, volatile precursors can be found. In the approach used in the '012 Patent for forming such films, separate precursor sources are used for each metal constituent of the film. However, film stoichiometry is difficult to maintain when two or more precursors which react individually on the growing film are used, due to differences in precursor vapor pressures, surface reaction rates, etc. To avoid such stoichiometry problems, single-source precursors have traditionally been sought which already contain a built-in stoichiometry: typically, such precursors contain two desired metallic elements bonded together, with several ligands attached to each element. Upon reaching the substrate, the single-source precursor ideally loses its ligands without changing the metal atom ratios. Unfortunately, single-source precursors have their own set of problems: they often have vapor pressures even lower than those of precursors containing only one metal atom; precursor stoichiometry may still not remain in the film (e.g. the heated substrate may evaporate one element at a significantly higher rate); such precursors are not directly applicable to non-integral stoichiometries; and such precursors are commercially uncommon.

Tightly controlled stoichiometry and grain size, homogeneity, and purity are particularly important for deposition of thin films of polycrystalline perovskite-phase niobates, zirconates, or titanates, such as $CaTiO_3$ (calcium titanate), $BaTiO_3$ (barium titanate), $SrTiO_3$ (strontium titanate), $(Ba,Sr)TiO_3$ (barium strontium titanate, or BST), or bismuth titanate. Under proper conditions, these materials may possess one or more interesting and useful properties, including: extremely high dielectric constant (generally greater than 200), high remanent polarization (or ferroelectric effect), and a high dependence of dielectric constant on temperature (or pyroelectric effect). As such, perovskites find application in dynamic random-access memory (DRAM), ferroelectric random-access memory (FRAM), infrared detectors, and other circuitry requiring high performance miniature capacitors. A CVD technique useful for such films and applications is highly desirable.

SUMMARY OF THE INVENTION

The present invention provides a method for chemical vapor deposition of thin films of metal oxides, particularly perovskite-phase mixed-metal oxides. This invention is particularly applicable to low-temperature depositions, controlled stoichiometry depositions and/or depositions requiring high purity and homogeneity.

It is possible to create metal-organic precursors having carboxylate-like ligands, which may be defined generally as $O_2CR$, where R is preferably an alkyl, aryl, substituted alkyl or aryl, or halogenated hydrocarbon substituent. Such precursors are economical, may react, e.g. with alkoxides, to form esters, and have now been found to have acceptable volatility for CVD in some instances. Unfortunately, metal-organic precursors having carboxylate-like ligands typically thermally decompose to form undesirable stable products, such as metal carbonates and/or fluorides. For example, barium acetate thermally decomposes between 400° C. and 600° C. to form barium carbonate, which is generally stable to a temperature of 750° C. to 900° C. This stability presents a difficulty for applications such as microcircuits; high temperatures which would typically damage such microcircuits are required to remove carbon impurities incorporated into such a film. As such, precursors having carboxylate-like ligands have not been considered good candidates for metal oxide film formation in microcircuit applications. However, a method which uses carboxylate-like precursors has now been found which avoids the formation of carbonates/fluorides. This is apparently the first perovskite-phase mixed-metal oxide thin film CVD technique to succesfully use metal-organic precursors having carboxylate-like ligands in a low-temperature deposition process, without formation of a metal carbonate and/or fluoride phase within the film.

It has now been found that chemical vapor deposition of a thin film may be performed for example by supplying two or more vapor-phase precursors such as a metal carboxylate and a metal alkoxide which may be made to, instead of decomposing separately and forming an undesirable carbonate, react with each other to form volatile esters and desired solid-phase components upon contacting or closely approaching a heated substrate. Preferably, the reaction or reactions which form volatile esters (i.e. ester elimination reactions) also leave the desired metallic elements adsorbed on the substrate surface, such that film stoichiometry may be controlled by the ester elimination reaction.

The present invention has several advantages when compared with prior art CVD methods. For mixed-metal oxide films, precursors applicable to the present invention generally have higher vapor pressure than single-source precursors, are simpler in composition than single-source precursors, and react at a lower substrate temperature. For instance, barium compounds with sufficient volatility for CVD applications are rare, at least partially due to the tendency of barium to oligomerize; the present invention may be used with a barium precursor with improved volatility and which resists oligomerization, such as $Ba(O_2CCH_3)_2 \cdot 18\text{-crown-}6$. Also, many of the prior art problems with multiple precursors such as poor stoichiometry control and incorporation of impurities are mitigated since precursors react with each other (rather than thermally decompose) at the substrate, generally at a temperature insufficient to cause thermally-induced decomposition of the organic supporting ligands. Formation of the volatile ester reaction products enables a more complete removal of possible contaminants from the film surface during growth. It is also believed that the methods used herein may impart some structure to the film during precursor reaction, thus making perovskite-phase crystal formation easier to accomplish.

In one aspect, the present invention relates to a method of depositing a thin film on a semiconductor substrate. This method comprises supplying first and second precursors in a dehydrated mixed stable phase, the first precursor having a general formula AX and the second precursor having a general formula BY. A is a metal preferably selected from the group consisting of barium, strontium, calcium, bismuth, and combinations thereof. B is a metal preferably selected from the group consisting of titanium, niobium, zirconium, and combinations thereof. Furthermore, X comprises at least one first organic ligand coordinated to A having an empirical formula $O_2CR$, wherein R is preferably an alkyl, aryl, substituted alkyl or aryl, or halogenated hydrocarbon substituent. Y comprises at least one second organic ligand coordinated to B having an empirical formula OR', wherein R' is an organic substituent. This method further comprises contacting a liquid and/or vapor stream comprising the mixed stable phase with the semiconductor substrate while holding the substrate at a temperature sufficient to produce a surface-mediated ester elimination reaction between the first and second precursors on the substrate. This ester elimination reaction preferably reacts substantially all first organic ligands with second organic ligands to form volatile esters, thereby depositing an intermediate compound film comprising A, B, and O on the substrate.

This method may further comprise annealing the intermediate compound film at a predetermined temperature (preferably less than 500° C.) such that substantially all remaining Y ligands are vaporized, and/or such that the intermediate compound film is transformed into a polycrystalline film having an empirical formula $ABO_3$ (e.g. a perovskite). Annealing may be carried out in an oxidizing atmosphere. In any case, it may be possible to anneal as the film is being deposited.

A cyclic or acyclic multidentate organic coordinating compound, such as the cyclic polyethers 18-crown-6 and 15-crown-5 and acyclic polyether tetraglyme, may be coordinated to A to prevent oligomerization of the first precursor and/or enhance its volatility. BY may comprise an alkoxide, preferably $Ti(O^iPr)_4$ (i.e. tetraisopropyl titanate, or TPT). Alternately, BY may comprise a metal B coordinated to two or more ligands selected from the group consisting of alkoxyls, β-diketonates, β-ketoiminates, and Schiff bases (e.g. $Ti(O^iPr)_2(acac)_2$). In some embodiments, the mixed stable phase may be at least partially liquid when it contacts the substrate, whereby a spray pyrolysis mechanism is involved in film creation.

In another aspect of the invention, a method of forming a thin film of insulating material on a semiconductor substrate from a liquid containing suitable precursors is disclosed, wherein the insulating material has an empirical formula $ABO_3$ and A and B are selected as described above. This method comprises injecting droplets of the solution containing a suitable (preferably dehydrated) solvent and a liquid precursor mixture into a carrier gas stream, where the liquid precursor mixture comprises first and second liquid precursors in a molar ratio required to form the desired final metal oxide phase (preferably substantially 1:1). The first precursor has a formula $A(O_2CR)_2 \cdot L$ and the second precursor has a formula $BR'_x R''_{a-x}$, where:

R is a first organic substituent selected from the group consisting of alkyl, aryl, substituted alkyl or aryl and halogenated hydrocarbon constituents;

L is a multidentate ligand coordinated to A;

R' is an alkoxyl organic constituent;

R" is a third organic substituents selected from the group consisting of alkoxyls, β-diketonates, β-ketoiminates, Schiff bases, and combinations thereof; and x has a value between 1 and a, inclusive.

This method further comprises heating the carrier gas stream such that substantially all of the first and second liquid precursors are vaporized into corresponding first and second vapor precursors, and contacting this gas stream with the substrate. This method further comprises controlling the temperature of the substrate such that a surface-mediated ester elimination reaction between the first and second vapor precursors occurs at the substrate. This reaction preferably forms a volatile ester and may also form an intermediate compound film comprising A, B, and O on the substrate. This method may further comprise annealing the intermediate compound film in an oxygen-containing atmosphere, thereby converting the intermediate compound film into a film of insulating material. Preferably, precursor droplets are formed using an ultrasonic nebulizer, and preferably the carrier gas stream is initially pure nitrogen.

BRIEF DESCRIPTION OF THE DRAWINGS

This invention, including various features and advantages thereof, can be best understood by reference to the following drawing, wherein.

DETAILED DESCRIPTION OF THE PREFERRED EMBODIMENTS

The present invention includes a method for depositing thin films on a semiconductor substrate, which is described herein with reference to several specific embodiments and a specific apparatus for carrying out this method. However, it is believed that the present invention may generally be employed with other forms of CVD and/or precursor delivery. This method is also believed to be applicable to deposition of a simple metal oxide (e.g. $TiO_2$) by using the same metal in both AX and BY precursors, or to other mixed-metal oxides with a wide variety of valences for A and B.

Figure 1:
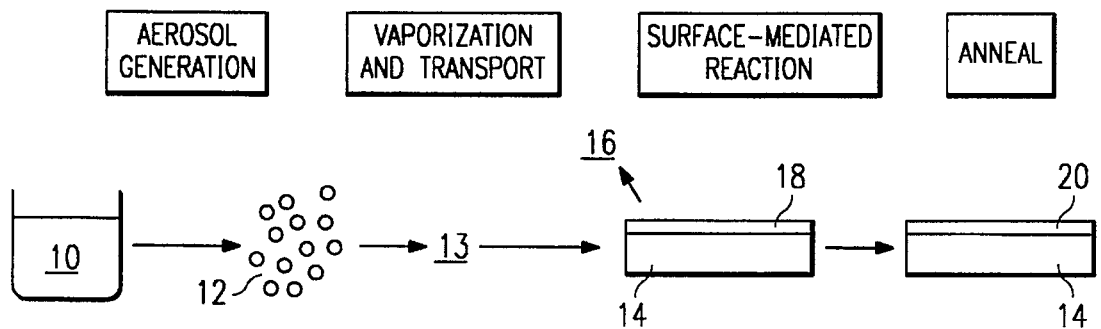
FIG. 1 shows a general flow diagram of a process according to the present invention.

FIG. 1 contains a flow chart representative of one embodiment of the invention. In this embodiment, a solution containing a mixture of precursors 10 is subjected to an aerosol generation process (e.g. ultrasonic nebulization or spraying through an orifice), creating droplets 12. Droplets 12 vaporize in a carrier gas stream 13. The carrier gas stream containing the vaporized liquid precursor mixture is then transported to the surface of a semiconductor substrate 14, where a surface-mediated reaction occurs. This reaction is preferably controlled by heating substrate 14 (preferably to a temperature less than that which would decompose the organic supporting ligands of either of the precursors, although somewhat higher substrate temperatures may be used in some embodiments), such that a volatile ester 16 is exhausted and an intermediate compound film 18 is deposited on substrate 14. Intermediate compound film 18 may still contain ligands from one of the precursors, and/or may not be fully reacted. This intermediate compound film may be annealed (preferably by raising the substrate temperature above that required for ester formation, and preferably in an oxygen-containing atmosphere) to produce a film of an insulating material (preferably a perovskite-phase titanate, niobate, and/or zirconate film).

Figure 2:
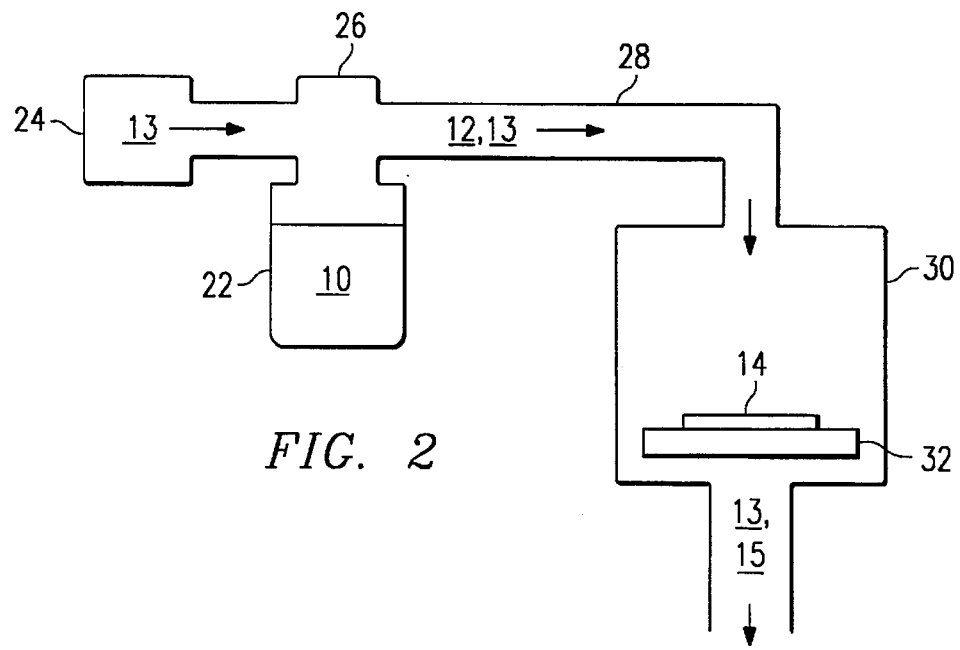
FIG. 2 shows a system for depositing a thin film according to the present invention.

FIG. 2 shows an aerosol-assisted CVD system useful in the present invention. A liquid precursor reservoir 22 supplies a solution containing a mixture of precursors 10 to an aerosol generator 26, which produces liquid precursor droplets 12. A carrier gas reservoir 24 supplies a carrier gas stream 13, which sweeps droplets 12 into transport section 28, which may also preheat gas stream 13 without substantially vaporizing droplets 12 (variations on this system may actually vaporize droplets 12 during transport). This gas stream enters reaction chamber 30, where it may be vaporized due to heating of the reactor walls or the substrate itself, but preferably droplets 12 are substantially vaporized prior to contacting substrate 14 in this embodiment. Substrate 14 is preferably maintained at a predetermined temperature by substrate heater 32, which may be, e.g., a resistive or a radiation type heater. Vaporized precursors in carrier gas stream 13 react immediate to (either on or adjacent to) the surface of substrate 14, producing a volatile ester 15 and a solid film (not shown) on the substrate. Ester 15 is carried out exhaust 34 with gas stream 13.

A variation on the present method which is essentially CVD without the necessity for complete vaporization is spray pyrolysis. A spray pyrolysis process may be used with the present invention by not preheating droplets 12 to the point where they are substantially vaporized; at least some of the precursors reach the heated substrate 14 as a liquid, where ester elimination may be accompanied by precursor vaporization at the substrate. Thus a mixed stable phase of first and second precursors useful in the present invention may be liquid, partially vaporized, or wholly vaporized before reaching the substrate. It is believed that stability is important; i.e. precursors should not decompose, react with the carrier gas or solvents, or react with each other before approaching the substrate.

The present invention differs from prior art methods particularly in the reaction mechanism employed in deposition. Prior art methods of deposition from metalorganic or organo-metallic precursors rely primarily on the heated substrate to decompose precursor compounds individually; in contrast, the present invention generally maintains the heated substrate at a lower temperature where individual precursor decomposition is not the primary reaction mechanism. This temperature, however, is sufficient to promote an esterfication reaction between two appropriate precursors. It is believed that such reactions promote increased homogeneity and help control stoichiometry of the deposited film, since a molecule supplied by the first precursor and a molecule supplied by the second precursor are needed in the reaction.

One combination of precursors applicable to ester elimination is a metal carboxylate first precursor and a metal alkoxide second precursor. As first precursors, Ca, Sr, and Ba carboxylates such as an adduct of barium acetate may be used. As a typical second precursor, $Ti(O^iPr)_4$ is available from commercial sources. These may be dissolved in a common solution such as pyridine for spray pyrolysis. It has been found, however, that other precursors may be preferable, particularly for deposition by CVD or aerosol-assisted CVD. For instance, a carboxylate or carboxylate-like precursor may be coordinated to a polyether to prevent oligomerization and enhance precursor stability and volatility, as shown in the following example.

$Ba(O_2CCH_3)_2 \cdot 18$-crown-6 was prepared by first dissolving 1.7472 g of 18-crown-6 in approximately 25 mL of $H_2O$. 1.6884 g of $Ba(O_2CCH_3)_2$ was added with approximately 25 mL of additional $H_2O$ and the solution was stirred. Dehydrating the first precursor is usually necessary to prevent reacting of the second precursor with water when the first and second precursors are combined. The solution was heated to evaporate $H_2O$ until about 15 ml remained, after which the remaining $H_2O$ was removed under vacuum. The remaining precursor material was verified to be $Ba(O_2CCH_3)_2 \cdot 18$-crown-6. It is believed that such a compound consumes the available Ba coordination sites, thus preventing oligomerization of the precursor in solution.

A mixed stable precursor was formed by adding 1 g of $Ba(O_2CCH_3)_2 \cdot 18$-crown-6 to a solution of 0.5469 g $Ti(O^iPr)_4$ in approximately 15 mL of pyridine. The mixture was exposed to ultrasonic radiation until both precursors were thoroughly dissolved. In one experiment, this mixed stable precursor was sprayed through an orifice into a 20 psi $N_2$ carrier gas, which carried small droplets of the precursor through a preheating section heated to 60° C., and into a reactor heated to 80° C. This gas stream was directed at a silicon wafer heated to 400° C. for 50 minutes. The resulting film was found to contain $BaTiO_3$ and $TiO_2$, and contained no measurable $BaCO_3$.

Precursors such as barium acetate and $Ba(O_2CCH_3)_2 \cdot 18$-crown-6 readily thermally decompose to form barium carbonate. In the film described above, barium carbonate was not found. Thus ester elimination, and not thermal decomposition, is believed to be the primary reaction mechanism involved in the deposition. It is also believed that this reaction controls stoichiometry and homogeneity of the deposited film.

As an alternative, more than one type of organic constituent or ligand may be attached to a metal atom to form AX or BY. For example, if B is tetravalent, BY could have the general form $B(OR')_x(R'')_{4-x}$, where x=1, 2, 3, or 4, and OR' ligands are used in the ester elimination reactions. R'' ligands may comprise ligands such as other alkoxyls, β-diketonates, β-ketoiminates, or Schiff bases. In such a precursor, x preferably would be chosen to provide an OR' ligand to react with each X ligand of the AX compound (e.g. for A=Ba and B=Ti, preferably x=2), as this is believed to provide good stoichiometric control. An example of such a precursor is $Ti(O^iPr)_2(acac)_2$.

Typically, the molar ratio of, e.g., divalent metal A to tetravalent metal B, is tightly controlled and near 1:1 for many perovskite-phase metal oxides. It has generally been found that, for example, if B is titanium, the electrical properties of a final dielectric film may be improved, or at least not degraded, by slightly titanium-rich compositions. Advantageously, precursors AX and BY of the present invention may be chosen to supply more Y ligands than X ligands to the ester elimination reaction, thus driving the elimination of X to completion. If slightly more precursor BY than precursor AX (preferably a molar ratio AX to BY of between 1.0:1.0 and 1.0:1.1 is used) is supplied to the deposition process, it may be ensured that the ratio of A to B in the final film will not fall below 1:1, and in some cases titanium-rich films (preferably up to 5% excess titanium) may be deposited.

The present invention may also be used to form doped mixed-metal oxides, where dopant atoms (typically in a concentration less than 5% of the concentration of A atoms) are used to enhance the electrical characteristics of the oxide film. For example, lead is generally not preferred for microcircuit applications, but may be used in small mounts in a film according to the present invention. Other useful dopants include acceptor dopants such as Mn and Mg which may substitute, e.g. for Ti in a titanate film, and donor dopants such as Dy, Ho, and Er which may substitute, e.g. for Ba or Sr, in a perovskite film. Such a dopant may be added to the present invention as a third precursor and designed to participate appropriately in the ester elimination reaction, or possibly pyrolize separately on the substrate surface if its ligands do not cause a problem in film composition.

Many other compositions other than those described are believed to be useful in the present invention. For example, R substituents other than $CH_3$, such as propyl, butyl, phenyl, $CCl_3$, $CF_3$, $CH_2CF_3$, etc., may be used in a first precursor. The multidentate ligand L may be either cyclic or acyclic. The donor atoms in the multidentate ligand may be O, N, S, P, or any combination thereof. Many hydrocarbon solvents, including pyridine, ethers, mines, and alcohols, may be useful in creating a precursor mixture.

The present invention is not to be construed as limited to the particular examples described herein, as these are to be regarded as illustrative, rather than restrictive. For example, compound films having 3 or more metallic elements may be made by combining multiple precursors in an appropriate ratio (e.g. 60:40:100 molar adducts of barium and strontium formate and TPT). Intermediate compound films may be annealed in inert or reducing atmospheres. Multiple liquid precursor sources with individual bubblers or atomizers, as are common in the art, are also comprehended by the present invention, and vaporization of the precursors may occur during vapor transport or in the reaction chamber. The carrier gas may also comprise the annealing atmosphere, with the substrate undergoing annealing concurrently with deposition. A dielectric film deposited according to the present invention may have many other applications, e.g. as a gate dielectric for a field-effect transistor integrated on a semiconductor device.

What is claimed is:

1. A method of depositing a thin film on a semiconductor substrate, said method comprising:
   (a) supplying first and second precursors in a dehydrated mixed stable phase, said first precursor of the formula $A(O_2CR)_2$, and said second precursor of the formula $BR'_xR''_{4-x}$, wherein:
      (i) A is a metal selected from the group consisting of barium, strotium, calcium, and combinations thereof;
      (ii) B is a metal selected from the group consisting of titanium, niobium, zirconium, and combinations thereof;
      (iii) R is selected from the group consisting of alkyl, aryl, and halogenated hydrocarbon substituents;
      (iv) R' is an alkoxyl organic substituent;
      (V) R" is a third organic substituent selected from the group consisting of alkoxyls, β-diketonates, β-ketoiminates, Schiff bases, and combinations thereof; and
      (vi) x has a value selected between 1 and 4, inclusive; and
   (b) contacting said first and second precursors in said mixed stable phase with said substrate while holding said substrate at a temperature sufficient to produce a surface-mediated ester elimination reaction between said first and second precursors without substantial thermal decomposition of said first precursor, said reaction forming a volatile ester $R'O_2CR$ and depositing an intermediate compound film comprising A, B, and O on said substrate.

2. The method of claim 1, further comprising annealing said intermediate compound film, thereby removing from said intermediate compound film substantially all of said alkoxyl organic substituent R' remaining after said ester elimination reaction.

3. The method of claim 2, wherein said annealing step also crystallizes said intermediate compound film, thereby forming a polycrystalline film having an empirical formula $ABO_3$.

4. The method of claim 3, wherein said annealing step is carried out in an oxygen-containing atmosphere.

5. The method of claim 3, wherein said annealing step is carried out at a temperature less than 500° C.

6. The method of claim 3, wherein said annealing step occurs simultaneously with said reacting and said depositing steps.

7. The method of claim 2, wherein said annealing step occurs simultaneously with said reacting and said depositing steps.

8. The method of claim 1, wherein said first precursor further comprises a multidentate ligand L coordinated to A, said first precursor having a formula $A(O_2CR)_2 \cdot L$.

9. The method of claim 8, wherein said multidentate ligand L is cyclic.

10. The method of claim 9, wherein said cyclic multidentate ligand L is a crown ether selected from the group consisting of 18-crown-6 and 15-crown-5.

11. The method of claim 8, wherein said mixed stable phase is vaporized prior to said contacting step.

12. The method of claim 1, wherein said contacting step comprises spraying said mixed stable phase onto said substrate as a liquid, thereby forming said intermediate compound film by spray pyrolysis.

13. The method of claim 1, wherein said mixed stable phase further comprises a third precursor, said third precursor comprising a dopant D, said dopant D selected from the group consisting of Pb, Mn, Mg, Dy, Ho, Er, and combinations thereof, said dopant D having a molar concentration in said mixed stable phase less than 5% of the molar concentration of said metal A in said mixed stable phase.

14. A method of forming a thin film of insulating material on a semiconductor substrate, said insulating material having an empirical formula $ABO_3$, where A is a divalent metal selected from the group consisting of barium, strontium, calcium, and combinations thereof, where B is a metal selected from the group consisting of titanium, niobium, zirconium, and combinations thereof, said method comprising:

(a) supplying a gas stream comprising a dry carrier gas and first and second precursors in a dehydrated mixed stable vapor phase, said first precursor having an empirical formula $A(O_2CR)_2 \cdot L$ and said second precursor having an empirical formula $BR'_x R''_{4-x}$, wherein:

(i) R is a first organic substituent selected from the group consisting of alkyl, aryl, and halogenated hydrocarbon substituents;

(ii) L is a multidentate ligand coordinated to A;

(iii) R' is an alkoxyl organic substituent;

(iv) R" is a third organic substituent selected from the group consisting of alkoxyls, β-diketonates, β-ketoiminates, Schiff bases, and combinations thereof; and (v) x has a value selected between 1 and 4, inclusive; and (b) contacting said gas stream with said substrate;

(c) controlling the temperature of said substrate, thereby producing a surface-mediated ester elimination reaction between said first and second precursors, said reaction forming a volatile ester and forming an intermediate compound film comprising A, B, and O on said substrate; and (d) annealing said intermediate compound film in an oxygen-containing atmosphere, thereby converting said intermediate compound film into said film of insulating material.

15. The method of claim 14, wherein said first and second precursors in said gas flow are supplied in a molar ratio of between 1.0:1.0 and 1.0:1.1.

16. The method of claim 14, wherein said mixed stable vapor phase is constructed by mixing a first vapor comprising said first precursor and a second vapor comprising said second precursor.

17. The method of claim 14, wherein said mixed stable vapor phase is constructed by injecting droplets comprising said first and second precursors into said dry carrier gas and vaporizing said droplets in said dry carrier gas.

18. The method of claim 14, wherein said annealing step occurs simultaneously with said forming an intermediate compound film step.

19. The method of claim 14, wherein x=2.

20. The method of claim 19, wherein R' is isopropyl and R" is acetylacetonate.

21. The method of claim 14, wherein said second precursor is $Ti(O^iPr)_4$.

22. The method of claim 14, wherein said multidentate ligand L is a crown ether selected from the group consisting of 18-crown-6 and 15-crown-5.

23. A method of forming a thin film of insulating material on a semiconductor substrate, said insulating material having an empirical formula $ABO_3$, where A is a divalent metal selected from the group consisting of barium, strontium, calcium, and combinations thereof, where B is a metal selected from the group consisting of titanium, niobium, zirconium, and combinations thereof, said method comprising:

(a) injecting droplets of a dehydrated liquid precursor mixture into a dry carrier gas stream, said liquid precursor mixture comprising first and second liquid precursors in a molar ratio of substantially 1:1, said first precursor having a formula $A(O_2CR)_2 \cdot L$ and said second precursor having a formula $BR'_2 R''_2$, wherein:

(i) R is a first organic substituent selected from the group consisting of alkyl, aryl, and halogenated hydrocarbon substituents;

(ii) L is a multidentate ligand coordinated to A;

(iii) R' is an alkoxyl organic substituent; and (iv) R" is a third organic substituent selected from the group consisting of alkoxyls, β-diketonates, β-ketoiminates, Schiff bases, and combinations thereof;

(b) heating said carrier gas stream containing said droplets such that substantially all of said droplets are vaporized, thereby forming first and second vapor precursors corresponding to said first and second liquid precursors;

(c) contacting said carrier gas stream with said substrate;

(c) controlling the temperature of said substrate, thereby producing a surface-mediated ester elimination reaction between said first and second vapor precursors, said reaction forming a volatile ester and forming an intermediate compound film comprising A, B, and O on said substrate; and (d) annealing said intermediate compound film in an oxygen-containing atmosphere, thereby converting said intermediate compound film into said film of insulating material.

24. The method of claim 23, wherein step (a) comprises ultrasonically nebulizing said droplets from a liquid precursor source into said carrier gas stream.

25. The method of claim 23, wherein said carrier gas stream initially comprises substantially pure nitrogen.

* * * * *